United States Patent [19]

Palm et al.

[11] Patent Number: 4,777,622

[45] Date of Patent: Oct. 11, 1988

[54] ASSOCIATIVE DATA STORAGE SYSTEM

[75] Inventors: Guenther Palm; Hans T. Bonhoeffer, both of Tuebingen, Fed. Rep. of Germany

[73] Assignee: Max-Planck-Gesellschaft zur Foerderung der Wissenschaften e.V., Fed. Rep. of Germany

[21] Appl. No.: 801,794

[22] Filed: Nov. 26, 1985

[51] Int. Cl.[4] .................. G01C 11/40; G06F 13/00
[52] U.S. Cl. ..................................... 365/49; 364/900
[58] Field of Search ... 364/200 MS File, 900 MS File; 365/49

[56] References Cited

U.S. PATENT DOCUMENTS

| | | | |
|---|---|---|---|
| 3,257,646 | 6/1966 | Roth | 364/900 |
| 3,742,460 | 6/1973 | Englund | 364/200 |
| 4,047,160 | 9/1977 | Wolf | 364/900 |
| 4,254,476 | 3/1981 | Burrows | 365/49 |
| 4,445,172 | 4/1984 | Peters et al. | 364/200 |
| 4,523,301 | 6/1985 | Kadota et al. | 365/49 |

OTHER PUBLICATIONS

Parallel Processing for Associative & Neuronal Networks, Published by Gunther Palm & Tobias Bonhoeffer, Biol., Cybern., 51,201-204, (1984).
On Associative Memory, Published by G. Palm, Biol. Cybernetics, 36,19-31 (1980).

*Primary Examiner*—Raulfe B. Zache
*Assistant Examiner*—Ayni Mohamed
*Attorney, Agent, or Firm*—Handal & Morofsky

[57] ABSTRACT

A data storage system for storing a number of associations between pairs of data patterns, each including a plurality of data elements and having a plurality of data processing and storing units, and circuits for providing the data patterns to the processing and storing units, each of such units processing and storing information relating to different portions of at least one of the patterns.

6 Claims, 3 Drawing Sheets

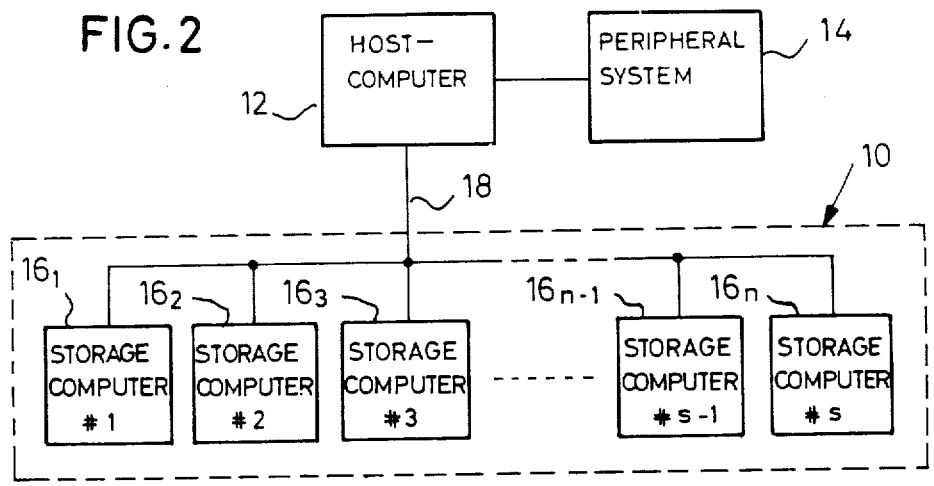
FIG. 2
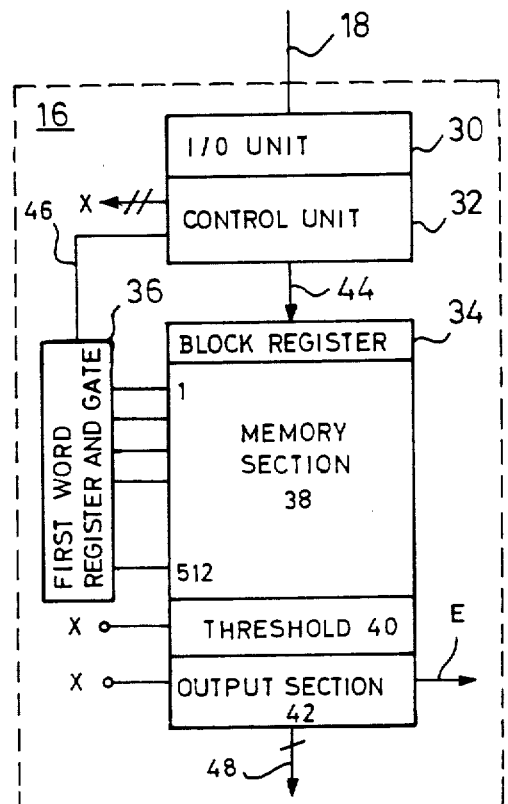
FIG. 1a
FIG. 1b
FIG. 3

ASSOCIATIVE DATA STORAGE SYSTEM

BACKGROUND OF THE INVENTION

The present invention relates to the electronic storage of data, more specifically to an associative memory. Associative memories including so called content-addressable memories have been proposed, which are digital data storage devices, in which digital data are stored in the form of data patterns or "words" comprising a series of data elements, as bits or bytes. The data can be retrieved by addressing the associative memory with an input word or part of it. Depending on the type of storage, the input word may be the data word itself or a word differing from the stored word. The output of the memory comprises the addressed stored data word but possibly also words associated with more or less similar input words, if an incomplete or partially wrong input word is used for retrieval. This flexibility is achieved by time-consuming serial search algorithms.

Another known type of associative memory does not rely on serial search procedures but uses the storage of correlations. Recent research has shown that the data word storage capacity of such an "associative correlation memory" is only a factor of about 2 less than to that of a conventional listing memory, such as a random access memory (RAM) or a conventional associative memory having the same number of memory cells or storage locations, if the data words used comprise relatively few NON-ZERO data elements compared with the total number of data elements in a data word, see e.g. G. Palm, "On Associative Memory", Biol. Cybernetics 36, 19–31, 1980. On the other hand, associative and especially correlation memories have many and important advantages over listing memories, such as RAM's, as is well known to those skilled in the art.

SUMMARY

It is an object of the present invention to provide a data storage system operable as an associative correlation memory which can be implemented by means of presently available hardware and which excells by fast operation and short write and read cycles.

According to the invention, an embodiment of an associative correlation data storage system comprises means for providing first and second digital data words, a host computer adapted to receive said data words, memory means, and data transfer means, such as a data bus coupled to communicate data between said host computer and said memory means. The first and second data words are selected from predetermined first and second types or sets of data words, respectively, and each data word consists of a pattern or sequence of data elements. The data elements may be binary digits (bits), bytes or groups of bits or bytes. Each data element can assume at least two states, i.e. at least one NON-ZERO (e. g. ONE) state and one ZERO state. The data elements of the second words (preferably of both words) are groupped into a plurality s of blocks, each of which comprises at least eight data elements of which no more than one out of eight is a NON-ZERO element. The memory means serves for storing the relationship or "association" of a large number of pairs of first and second data words, and includes a number of storage computers at least equal to the number of blocks in a data word of the second set. Each storage computer is assigned to a different block of said second words and comprises control means adapted to receive and transmit data word information to and from said host computer, and means to store and retrieve information about the relation between the first data words and those data elements of the corresponding second words, which belong to the data element block to which the storage computer is assigned. The pairs of first and second data words to be associated with each other, or in other words, first or "input" words and associated second or "information" words used for storage and retrieval are provided by the host computer with which each storage computer communicates. Each storage computer handles the operations relating to the associated block of the first data words. Since all of the storage computers operate in parallel and since each block comprises only a small proportion of NON-ZERO data elements, the write and read cycles of the present system are much shorter than that of a conventional associative memory (RAM). In a preferred embodiment, each data block of the information data words comprises the same small number of NON-ZERO data elements, such as one single NON-ZERO data element only, and all blocks of the second data words comprise the same number of data elements.

Further embodiments, features and advantages of the invention will become apparent to those skilled in the art upon reading the following description of preferred and more general embodiments of the invention.

BRIEF DESCRIPTION OF THE DRAWINGS

FIGS. 1a and 1b are simplified diagrams for explaining the principles of an associative memory;

FIG. 2 is a block diagram of a preferred embodiment of a storage system according to the invention;

FIG. 3 is a simplified diagram of a storage computer of the system shown in FIG. 2;

DESCRIPTION OF THE PREFERRED EMBODIMENTS

Figure 4:
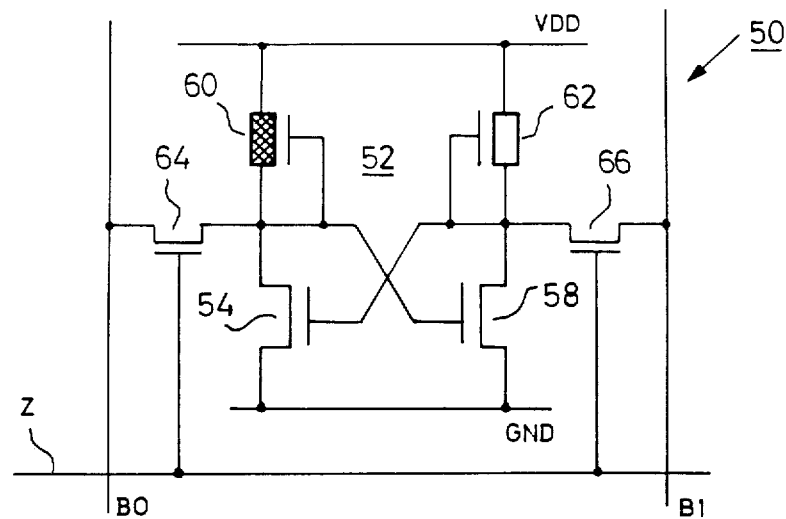
FIG. 4 is a schematic diagram of a preferred memory cell useful in the memory section of the storage computer of FIG. 3.

The present data storage system uses data words consisting of a plurality of data elements. Generally, each data element may comprise one binary digit (bit), one byte, or any group of bits or bytes. It will be assumed in the following description, unless stated otherwise, that the data elements consist of single bits, i.e. binary ONE's ("1") and "ZERO's ("0").

First, the principle of an associative memory is explained with reference to FIG. 1a. Assume a matrix of a first set of electrically conductive "row" wires and a second set of electrically conductive "column" wires crossing the row wires. At each crossing point, a switching device is connected between the respective crossing row and column wires. Further assume, that each switch can be closed by applying a predetermined voltage signal to each of the corresponding row and column wires. For storing, a desired first pattern of voltage signals is applied to the row wires and a second desired pattern of voltage signals is applied to the column wires. Each switch associated to a pair of row and column wires with a voltage signal applied thereon closes. When the voltage signals are removed, the "selected" switching devices remain closed and, thus, the matrix will "remember", that the previously applied "row" pattern belongs to the previously applied "column" pattern. If one of these patterns is applied to the corresponding set of wires, the other, "learned" pattern will appear at the other set of wires. Under specific conditions, the matrix can store more than one pattern association without interference and cross-talk. An example is shown in FIG. 1a: In case A, the row pattern 110100 is associated to the column pattern 010100 by the closed switches which are indicated by a solid dot. In case B, the row pattern 000011 is associated to the column pattern 101001 by the switches indicated by a small circle. These associated pairs of patterns do not interfere. However, in most cases, some degree of overlap will occur when a larger number of patterns is stored in the same memory matrix, and the overlap will cause errors.

These errors can be drastically reduced by providing a threshold as follows: It is checked, how many "1's" are comprised in the present input pattern, and this number is used as threshold, so that a wire produces an output signal only if it receives at least as many voltage signals ("1's") through closed switches from the input pattern as the input pattern contains "1's". Wires which are excited by less switches than the predetermined number must belong to a non-selected pattern and are disregarded.

While the described threshold does not gurantly absence of any errors, the probability of error is drastically reduced. E.g. in the situation shown in FIG. 1b, all three patterns are reproduced correctly if the correct threshold is used while otherwise no pattern at all will be reproduced correctly.

It has further been found, that the data storage capacity (i.e. the number of data element patterns which can be stored in a matrix having predetermined numbers of rows and columns, without an undue increase of the error probability) is also increased if the data patterns used comprise relatively few "1's" (or other NON-ZERO data elements), preferably no more than about 2% or 5% of the number of data element positions in the pattern. When this condition is met, the storage capacity of an associative matrix may be more than half of that of a conventional memory having the same number of "switches" (FIGS. 1a and 1b) or storage locations. This is a surprising and important result.

The error probability can be further reduced (and, thus, the storage capacity further increased), if the number l of "1's" per column differs from the number k of "1's" per row. More specifically, the number l of ones per column should be larger than the number k of "1's" per row if the row wires are used as input for the input word and the column wires are used as output wires for the retrieved information word. The ratio of l:k has an optimum depending on the number m of rows and the number n of columns of the matrix. For sufficiently large values of m and n, the number of "1's" per row k, the number of "1's" per column l, and the number of patterns z stored in the matrix, the mathematical expectation E(I) of the information storage capacity is about m.n (ln 2). Thus, for very large matrices with optimum values of k, l, and z, the storage capacity is about 0.69 times the storage capacity of a listing memory comprising the same number of storage locations (memory cells).

The row and column patterns of an associated pair of words do not need to be different. If identical row and column patterns are used, the memory is called an "auto-associative" memory. In this case, the matrix has, of course, the same number of rows and columns. A main application of auto-associative memories is the completion of patterns. Of course, the error probability will increase if only part of the complete address pattern is used.

The memory cells may be arranged in other coordinates than rows and columns.

Another application of an associative matrix explains the word "associative". If a stored pattern is addressed with an incomplete input word or if the threshold is reduced while using the correct complete input word, the matrix may produce output patterns which are different but similar to the correct pattern, or a superposition of similar patterns stored in the matrix. Such "errors" may be regarded as "associations". Furthermore, the output of the matrix received under the above conditions may be fed back to the input of the matrix while the threshold is increased or decreased, to obtain new "associations". The output of the matrix may then jump from pattern to pattern somewhat similar to a chain of associations produced by the human brain.

It follows from the above explanation, that the storage capacity of an associative matrix of memory is not very much inferior (only by a factor of about two) to that of a conventional memory such as a RAM, however, the speed of operation is much higher than that of a conventional memory, and an associative memory is more flexible and more tolerant to errors.

DESCRIPTION OF PREFERRED EMBODIMENTS

For the following explanation it will be assumed that the first and second data words to be associated to each other are provided by an appropriate coding in the host computer 12 or the peripheral system 14 and are therefore patterns of data elements selected from predetermined first and second sets of words, respectively. It is further assumed, that the data elements are binary digits (bits), and that the data words of the first and second sets have the same "lengths", i.e. the same number of data elements. Further, the data elements of each word form subsequent blocks of data elements, each block comprising the same number of data elements, only one single data element of each block being a non-zero data element, i.e. a "1". The number of data elements in each block is at least eight and preferably much greater than this number, so that a data word comprises only a small proportion of NON-ZERO data elements, e.g. 0.1 to 5%, in special cases up to 10 or 15%.

Thus, under the above exemplary assumptions, each data word has the following form:

$A_{11}, A_{12}, \ldots A_{1r}, A_{21}, A_{22}, \ldots A_{2r}, \ldots A_{s1}, A_{s2}, \ldots A_{sr}$, wherein s is the number of blocks in each word, and r is the number of data elements in each block. In the example of FIG. 2, s=16 and r=32.

It should be noted, that in a more general case, the blocks may have different numbers of data elements, and the number of NON-ZERO data elements in the individual blocks may be more than one and different in different blocks. Preferably, each block processed by an individual storage computer comprises only a small number of NON-ZERO data elements, e.g. less than 10 or even less than 5. Further, as mentioned above, the number of blocks and/or data elements in the first and second data words of a pair of associated data words may be different. The first or "input" words may even not be organized in blocks, however preferably the condition, that the majority of the data elements of the address word are "0's" is fulfilled also in this case.

For the following description, it is assumed that each data word comprises 512 bits forming 16 blocks each comprising 32 bits of which one is a "1".

The digital data storage device shown diagrammatically in FIG. 2 is operable as an associative correlation memory and comprises, as main components, a memory section 10, a host computer 12, a data link as a multi-line data bus 18 coupling the host computer to the memory section, and a peripheral system 14 including e.g. a usual keyboard or another computer and coupled to the host computer for entering data into the host computer and receiving output data from the host computer.

The storage section 10 comprises a plurality $s=16$ of individual storage computers $16_1$, $16_2$, $16_3$, .... $16_{s-1}$ and $16_s$. All of the storage computers 16 are coupled with the host computer 12 through the multi-line data bus 18.

The storage computers $16_1$ ... $16_s$ are identical, thus it will be sufficient to describe one of them with reference to FIG. 3.

The storage computer 16 shown schematically in FIG. 3 is intended to handle the operations related to the processing of one single block of the second in a pair of associated data words, which will be referred to as "information" word, while the other word in the pair will be referred to as first or "input" word. However, these terms should not be construed in a limiting sense.

Each storage computer 16 comprises an input/output (I/O) unit 30, a control unit 32, a block register 34, a 1st-word-register and gate unit 36, a memory section 38, a threshold section 40, and an output section 42.

The I/O unit 30 has its input coupled through bus 18 with the output of the host computer 12, and provides signals to the control unit 32 which has data outputs 44, 46 coupled to the block register 34 and unit 36, respectively.

The memory section 38 comprises 16384 storage locations organized in 512 rows and 32 columns comprising corresponding row and column lines. It is assumed, that the function of a storage location is similar to that of a switch adapted to assume open and closed states, and adapted to be closed by coincident signals "1" on both the corresponding row and column lines.

The 512 row lines are each coupled to a corresponding of 512 register stages (not shown) of unit 36 through an appropriate transmission gate circuit (not shown). The 32 column lines have their input terminals coupled to corresponding stages of the block register 34, and their output terminals to individual stages of the threshold unit 40. The threshold stages of threshold unit 40 are adapted to be set by a control signal received at a control input x from the control unit, to an appropriate threshold value, which may correspond to the number of "1's" in the word which the control unit has passed into the 1st-word-register. The output signals of the threshold stages of threshold unit 40 are coupled to the output section 42 which comprises an error detecting circuitry responsive to the occurence of more than one "1" (or more generally, output signals of predetermined value from more columns than the respective block includes NON-ZERO data elements in the output of the memory section 38, and has a multi-terminal output 48 which provides a 1-OUT-OF-32 signal (or if an appropriate coder is included in section 42, an appropriate coded signal) which constitutes the output signal corresponding to the block to which the unit 16 is associated. Further, output section 42 has an error output E which provides an error signal if and when more than one threshold stage provides an output signal of the value "1". The components of the storage computer 16 will be explained in more detail below.

The I/O unit may be a commercial integrated circuit, as a parallel input/output device type 8255 PIO. The control unit may be implemented by a microcomputer, as type ZX-81.

The block register 34 may be a conventional shift register having 32 stages and an output terminal at each stage. The unit 36 may comprise a similar 512 stage shift register, the stages having individual output terminals coupled through an individual transmission gate circuit to the corresponding row line. The storage locations of the memory section 38 may each be implemented by a circuit as shown in FIG. 4 which will be explained below.

The circuitry associated to each column of storage locations or memory cell is shown and explained below with reference to FIG. 5.

The storage location or memory cell circuit shown in FIG. 4 is associated to the crossing of a specific row line consisting of a conductor Z, and a secific column line consisting of a pair of conductors B0, B1, and comprises a conventional MOSFET flipflop circuit comprising a pair of FET's 54, 58 having the gates coupled to the drain of the respective other FET. The source-drain path of transistors 54, 58 are coupled in series with respective load resistors 60, 62 between an operating voltage $V_{DD}$, and ground GND. The load resistors 60, 62 may be implemented by FET's as shown and have different resistances chosen so that the flipflop assumes a predetermined state (as that corresponding to the storage of a "0"), when the power is switched on. The junction between FET 54 and load resistor 60 is coupled through a gate transistor 64 to the first column conductor B0, and the junction between FET 58 and load resistor 62 is coupled through a second gate transistor 66 to the second column conductor B1 associated with the memory cell under consideration. The gate electrodes of FET-transistors 64, 66 are coupled to the corresponding row line Z.

Figure 5:
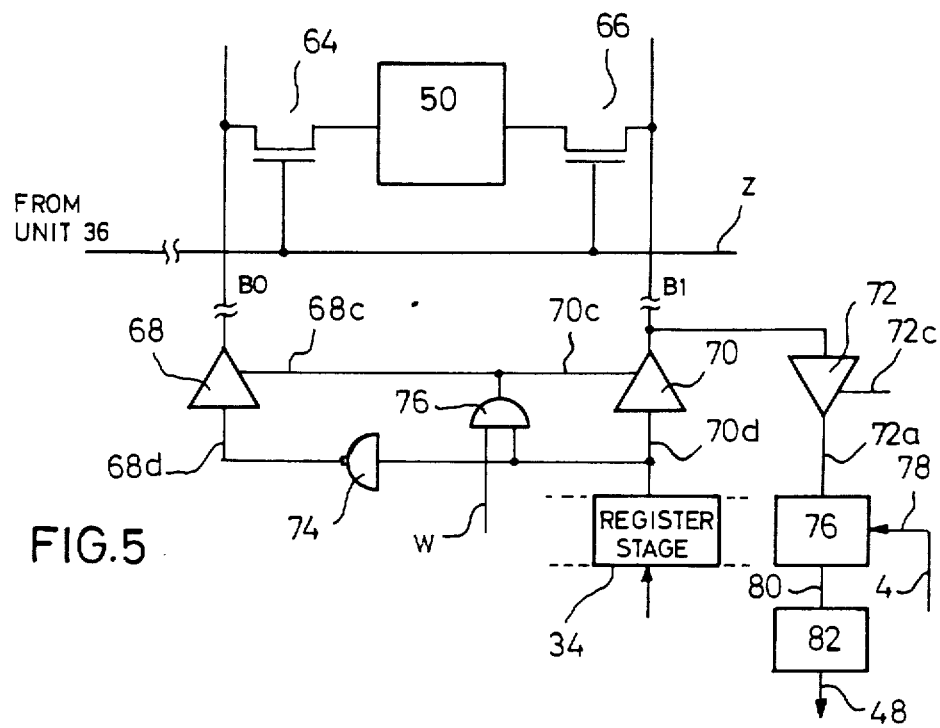
FIG. 5 is a diagram, partially in block form, of the circuitry associated to each column of memory cells as shown in FIG. 4.

Reference is now made to FIG. 5. The column conductor B0 is coupled to the output of a controllable gate 68 having a data input 68d and a control input 68c. The second column conductor B1 is coupled to the output of a controllable gate 70 having a data input 70d and a control input 70c. Conductor B1 is further coupled to the input of a controllable gate circuit 72 having a data output 72A and a control input 72c. The stage of register 34 associated to the column in which the memory cell 50 is located, is coupled with its output to data input 70d directly and with data input 68d through an inverter or NOT-gate 74. The output of the register stage in question is further coupled to a first input of an AND gate 76 having its second input coupled to receive a "write" signal W from the host computer through the control unit 32, and having its output coupled to the control inputs 68c and 70c.

The output of gate 72 is coupled to a count-down input of a counter 76 which further has a set input 78 for entering a desired threshold value, and an output 80 which provides an output signal when the counter has counted down to zero. The output 80 is coupled to an output register 82 which stores the output of the corresponding column. The register 82 may be implemented by a stage of register 34 since the registers 34 and 82 are used alternatively for writing and reading. The output signals of the registers 82 of the columns of the memory computer 16 are coupled to an appropriate error detecting threshold circuit (not shown), which provides the error signals E if more than one register 82 stores a "one". The outputs of the registers 82 of the memory computer 16 constitute the block output pattern of the storage computer and may be provided at a corresponding number of output terminals, or coded into any other form, e.g. a binary number.

The associative memory described with reference to FIGS. 2 to 5 operates as follows: A pair of first and second data patterns or words to be associated with each other are entered through the peripheral system into the host computer 12. The host computer passes the second or "information" word to the bus 18 and each storage computer 16 selects the associated block of this word and stores the selected block in the block register 34. Thus, storage computer $16_1$ selects the first block, storage computer $16_2$ the second block and so on. Further, the host computer provides the first or "input" word through the bus 18 to each storage computer 16 where this second word is stored in the 1st-word-register and gate unit 36. The control unit provides a write signal W to AND-gate 76 of each column, however, only the column conductors of that column are energized which are coupled to the stage of the register 34 which stores the single "1" of the stored block.

Then, the control unit activates the subsequent transmission gates of unit 36 so that the 512 row conductors Z are energized one after the other. Thus, the storage cells 50 of the energized column which also receive a "1" on their row line are switched into the "1" state. Thus, the pattern association is stored in the memory section 38 of each storage computer 16 as explained with reference to FIG. 1a. During writing, all of the selected row lines may be energized simultaneously.

For reading the associative memory, the first or input word to be used for retrieval is stored by the host computer in the register and of the unit 36 of each storage computer 16. A read signal is applied to the read input 72c of each gate 72, and the counter 76 is set to the desired threshold value, i.e. eight, which is the maximum number of output signals which a column can produce under the above assumptions. Now, the gates of unit 36 are energized subsequently to energize in turn subsequently those row lines which correspond to the stages of the 1st-word-register which store a "1". An addressed memory cell 50 which stores a "1" produces an output signal which is passed through gate transistor 66 and gate 72 to the count-back input 72a of counter 76, thus, each "1" is counted back by counter 76. If the counter 76 counts back to zero, it provides an output signal which is stored in register 82.

The output terminals of the registers 82 of all of the columns of the storage computer 16 may be coupled to an error detecting circuit, as a threshold circuit (not shown) having a threshold of 1.5 so that it produces an error signal E if more than one of the column registers 82 stores a "1". The output terminals of the registers 82 provide under normal conditions a 1-OUT-OF-32 signal which is the output pattern of the respective block of the output word. The 1-OUT-OF-32 signal may be led out of the storage computer and the 1-OUT-OF-32 patterns of all storage computers $16_1$ to $16_n$ may be combined to provide the output word. Alternatively, the output pattern of each storage computer may be coded as a binary number and the binary numbers provided by the storage computers may be processed to the desired output pattern as known in the art.

In the embodiment described with reference to FIGS. 3 to 5, the row lines of memory section 38 were energized subsequently by the unit 36. It may be desirable to energize all of the row lines simultaneously to speed up the operation of the memory section. A modification of the memory section of a storage computer which operates in a fully parallel and partially analog manner is shown in FIG. 6.

Components of the memory section 138 of FIG. 6, which correspond to components of the memory section described with reference to FIGS. 3 to 5 have been provided with the same reference numbers increased by 100.

Figure 6:
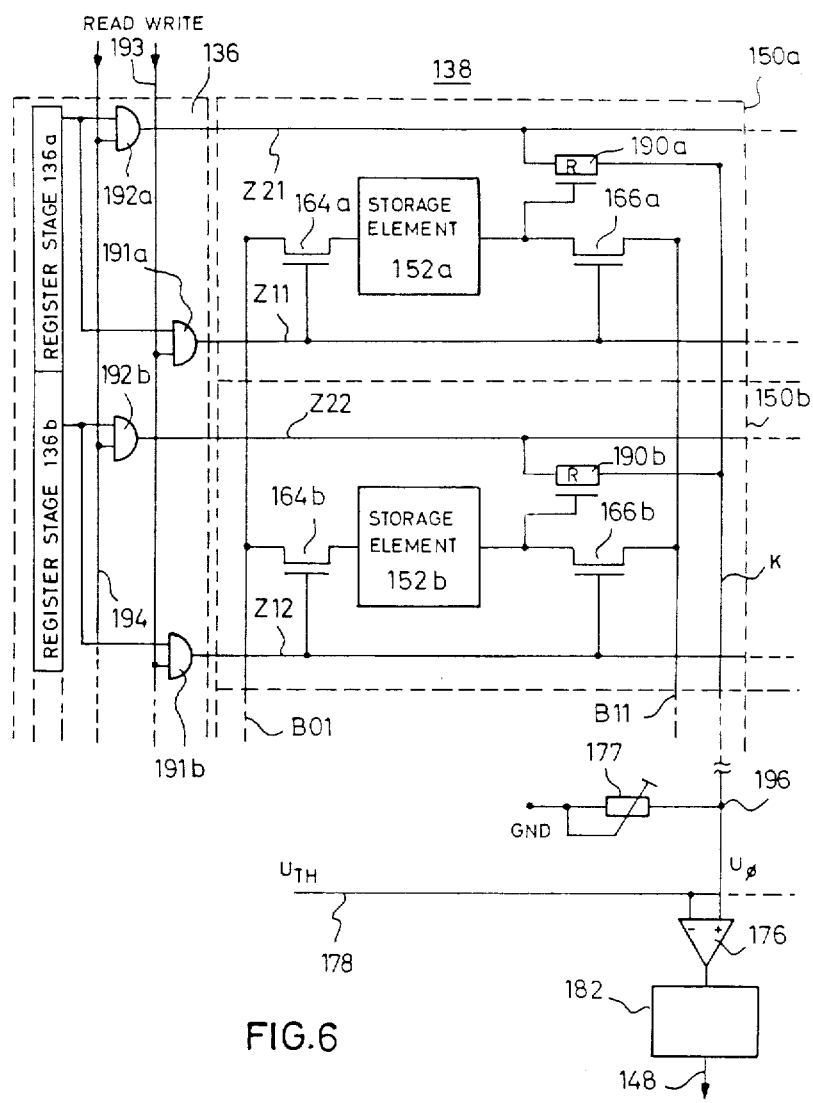
FIG. 6 shows a diagram, partially in block form, of part of a modified memory section.

In the memory section 138 of FIG. 6, each row line comprises a pair of row wires or conductors Z11, Z21; Z12, Z22, . . . , and each column line comprises three column wires or conductors B01, B11, and K.

Each memory cell 150a, 150b, . . . comprises a storage element 152a, 152b, . . . which may be a flipflop circuit 52 as shown in FIG. 4, if the data elements used are bits. Each storage element is coupled through a pair of gate elements 164a, 166a; 164b, 166b, . . . to the first and second column conductors B01, B11, respectively, similar as shown in FIG. 4. The gate electrodes of the gate elements are coupled to a first row conductor Z11, Z12, ... (corresponding to the row conductor Z in FIG. 4) of the corresponding pair of row conductors. In so far, the memory cells 150 are identical to the memory cell 50 of FIG. 4.

In addition to the circuitry of FIG. 4, a controllable resistor element 190a, 190b, . . . is provided in each memory cell 150a, 150b, . . . . The controllable resistor element may be implemented by a field effect transistor (FET) having its gate electrode coupled to the junction between the storage element 152 and the gate element 166 of the respective memory cell and having its source-drain path coupled between the second row conductor of the corresponding pair, and the third column conductor K. The controllable resistor responds to the storage condition of the storage element and has an essentially infinite resistance when the storage element stores a "0", and some predetermined resistance value when the associated storage element stores a "1". The third column conductor K is coupled to the (+) input of a differential amplifier 176 which operates as threshold circuit and has its (−) input connected to a conductor 178 to which a threshold voltage $U_{TH}$ is applied. Further, the third column conductor K is coupled to a reference potential, such as ground, through a bias resistor 177.

Each first row conductor Z11, Z22, . . . is coupled to the output terminal of a corresponding AND gate 191a, 191b, . . . . A first input terminal of each gate 191a, 191b, . . . is coupled to a corresponding register stage 136a, 136b, . . . of a 1st-word register and gate unit 136. The second input terminals of the gates 191a, . . . are connected to a common conductor 193, which receives a WRITE signal from the control unit 32 (FIG. 3). Each second row conductor Z21, Z22, . . . is connected to the output of an individual AND gate 192a, 192b, . . . which also may form part of unit 136. Each gate has a first input coupled to the corresponding register stage 136a, . . . . The second inputs of all of the gates 192a, 192b, .

. . are coupled to a common conductor 194 which receives a READ signal from the control unit 32 (FIG. 3). The output of the differential amplifier 176 is coupled to a register stage 182.

The modified memory section described with reference to FIG. 6 operates as follows: The bit patterns resulting from the association of different pairs of data words are stored in the storage elements 152a, 152b, . . . of the memory section 138 as described with reference to FIGS. 3 to 5.

The reading of the memory section is effected as follows: First, the first or input word used for retrieval of information from the memory section 138 is stored in the register portion of the unit 136. Then, a READ signal is applied to conductor 194. This signal primes all of the gates 192a, 192b. Those gates, the first input of which is coupled to a register stage storing a "1" will pass an appropriate voltage signal to their outputs, and thus, to the corresponding second row line Z21, Z22, . . . . Each controllable resistor 190a, 190b, . . . which is associated to a storage element 152, 152b, . . . storing a "1" passes the voltage signal through its resistive element to the third column line K. Thus, the voltage appearing at junction 196 between the column conductor K and the bias resistor 177 will depend of the number of storage elements storing a "1". The differential amplifier 176 will respond by providing an output signal to register stage 182 if and when the voltage at junction 196 exceeds a threshold voltage on conductor 178. Since all of the storage elements of the memory section 138 are operating in parallel when reading the memory section, the output signal at the output terminals 178 of the register stages 182 of the columns of the memory section 138 will appear with the least possible delay.

A still further embodiment of the invention is conveniently explained with reference to FIG. 2. Assume, the host computer is a conventional microcomputer, such as the commercially available type ZX-81, and each of the storage computers $16_1$ . . . $16_s$ is implemented by another individual microcomputer, such as type ZX-81 provided with a 32K byte memory extension and with a parallel input/output unit, as type 8255PIO, which communicates with the host microcomputer 12 through the multi-line bus 18.

The usual RAM comprised in a microcomputer is used as memory section 38 in the storage microcomputers. The threshold at output sections 40, 42 of the storage computers may be implemented by suitable software or similar as described with reference to FIGS. 3 to 5.

In the above described system, the host computer simply provides the row and column addresses of the non-zero data elements to the storage computers. These addresses may be e.g. the ordinal numbers of the non-zero data elements in the data element series forming the respective data pattern or word. Since each data word comprises relatively few non-zero data elements compared with the total number of data elements in the word, the addresses or ordinal numbers of the non-zero data elements require much less digits and, thus, much less transmission time than the entire word which is usually used for addressing. Each storage computer selects and processes the few or preferably single non-zero column data element address(es) and the non-zero row addresses by storing non-zero data in a storage location or cell of its RAM. The selection of the required rows and columns may be effected by a decoder, which receives the addresses and produces an appropriate output signal for the selected row or column. Such a decoder may be included in each unit 34 and 36 (FIG. 3). Of course, the memory cells used do not need to be arranged physically in rows and columns, they may form "virtual" rows and columns defined by the "row" and "column"0 addresses.

Reading of the memory section is effected by applying the addresses or ordinal numbers of the non-zero data elements in the first or input word to each storage microcomputer and using them for subsequently addressing the corresponding rows. The resulting "column" output signals which are produced by memory cells storing non-zero data, are counted or accumulated for each column and may be further processed by applying a threshold and/or error detection operation as described above. The output information may be coded similar as the information used for addressing, i.e. it may comprise the ordinal number of each column, which has delivered an output signal corresponding to a predetermined number of data elements of the first type.

The operation of this embodiment is also extremely fast because of the parallel processing by the storage computers, each of which processes a part (block) of each of the second or information words only, and because of the fact, that the words comprise only a small proportion of non-zero data elements, e.g. no more than 15% or preferably no more than 5% data elements of the first, non-zero type, so that at least 85% of the data elements are of the second, zero type.

The data stored in the storage locations or memory cells of the memory section 38 of the storage computers may be a non-zero data element other than a binary "1". The RAM of the ZX-81 microcomputer can store an eight-bit byte in each memory cell. Thus, any value up to decimal 255 may be stored in a memory cell as NON-ZERO data element. This may be used for simulating "forgetting". Thus, for example the value 255 may be stored when the information is written into the memory section, and this value may be decreased by one unit each time when the memory is read and the addressed memory cell does not belong to the selected pattern.

While a preferred embodiment of the invention and preferred modifications thereof have been described with reference to the drawings, various other modifications will occur to those skilled in the art and are within the scope of the appended claims.

We claim:

1. An associative correlation memory for storing a plurality of associations between pairs of corresponding first and second data patterns which each comprise a series of data elements, wherein each data pattern comprises data elements of a first type and data elements of a second type, no more than 5 percent of the data elements of each data pattern being of said first type, and wherein said memory comprises a large number of memory cells which are organized in first and second coordinates (such as rows and columns), means for storing an association between any given pair of data patterns by assigning the first data pattern of the pair to said first coordinates and the second pattern of the pair to said second coordinates, and storing a data element of a predetermined type in each memory cell, the first and second coordinates of which correspond to a data element of said first type in the respective first and second patterns assigned to said first and second coordinates, means for retrieving information about a stored association by addressing said first coordinates with the corresponding first data pattern of the stored association, and responsive to the number of addressed data elements of said first type in said second coordinates, and means which receive said data patterns and provide said storing means and said retrieving means with address information, which relates to said first data pattern.

2. The memory as claimed in claim 1, wherein ordinal numbers are assigned to said second coordinates, and the memory further comprises means for providing output information, which indicates the ordinal number of each second coordinate, which comprises at least a predetermined number of addressed data elements of said first type.

3. The memory as claimed in claim 1, wherein
at least one of said first and second patterns includes a plurality of data element blocks,
each block comprises the same plural number of data elements, and
the data elements of each block comprise only a small proportion of data elements of said first type.

4. The memory as claimed in claim 3, wherein all of said blocks comprise the same number of data elements.

5. The memory as claimed in claim 1, wherein said address information relates exclusively to those coordinates, which correspond to a data element of said first type, to select the so addressed coordinates.

6. The memory as claimed in claim 5, wherein ordinal numbers are assigned to the data elements in said first and second patterns, and said address information designates the ordinal number of each data element of said first type in the respective data pattern.

* * * * *